United States Patent
Völker

(10) Patent No.: US 8,933,709 B2
(45) Date of Patent: Jan. 13, 2015

(54) METHOD FOR DETERMINING RESIDUAL COUPLING OF AN INDUCTIVE CONDUCTIVITY SENSOR

(75) Inventor: Marco Völker, Dobeln (DE)

(73) Assignee: Endress+Hauser Conducta Gesellschaft fur Mess- und Regeltechnik mbH+Co. KG, Gerlingen (DE)

( * ) Notice: Subject to any disclaimer, the term of this patent is extended or adjusted under 35 U.S.C. 154(b) by 771 days.

(21) Appl. No.: 13/154,532

(22) Filed: Jun. 7, 2011

(65) Prior Publication Data

US 2011/0298478 A1 Dec. 8, 2011

(30) Foreign Application Priority Data

Jun. 7, 2010 (DE) .......................... 10 2010 029 762

(51) Int. Cl.
*G01R 27/28* (2006.01)
*G01R 27/22* (2006.01)
*G01F 1/56* (2006.01)
*G01R 35/00* (2006.01)

(52) U.S. Cl.
CPC . *G01R 27/22* (2013.01); *G01F 1/56* (2013.01); *G01R 35/005* (2013.01)
USPC ............................ 324/654; 324/656; 324/691

(58) Field of Classification Search
USPC ........................................................ 324/654
See application file for complete search history.

(56) References Cited

U.S. PATENT DOCUMENTS

| | | | |
|---|---|---|---|
| 4,740,755 A | 4/1988 | Ogawa | |
| 6,232,786 B1 * | 5/2001 | Barnett | 324/691 |
| 6,414,493 B1 * | 7/2002 | Rezvani | 324/442 |
| 6,634,238 B2 * | 10/2003 | Budmiger | 73/861.17 |
| 7,194,918 B2 * | 3/2007 | Brockhaus et al. | 73/861.12 |
| 8,714,027 B2 * | 5/2014 | Drahm et al. | 73/861.12 |
| 2006/0243050 A1 | 11/2006 | Quackenbush | |
| 2008/0262796 A1 * | 10/2008 | Rufer et al. | 702/184 |
| 2011/0140716 A1 * | 6/2011 | Wang et al. | 324/654 |

FOREIGN PATENT DOCUMENTS

| | | |
|---|---|---|
| DE | 41 16 468 A1 | 11/1992 |
| DE | 196 16 946 A1 | 11/1997 |
| DE | 694 25 160 T2 | 3/2001 |
| DE | 10 2008 048 995 A1 | 4/2010 |

OTHER PUBLICATIONS

German Search Report

* cited by examiner

*Primary Examiner* — Huy Q Phan
*Assistant Examiner* — Adam Clarke
(74) *Attorney, Agent, or Firm* — Bacon & Thomas, PLLC

(57) ABSTRACT

A method for determining residual coupling of an inductive, conductivity sensor, in which the conductivity sensor is surrounded by a measured medium and an equivalent impedance of the medium is calibrated with a variable compensation impedance. The variable compensation impedance and the equivalent impedance of the medium act on a measuring coil of the conductivity sensor with a phase shift of 180°. In order to be able to perform a measuring of the residual coupling with a high accuracy of measurement at any time during operation of the conductivity sensor, the variable compensation impedance is varied until an output voltage of the measuring coil of the conductivity sensor assumes a minimum voltage; wherein the minimum voltage corresponds to the residual coupling of the inductive, conductivity sensor.

10 Claims, 2 Drawing Sheets

METHOD FOR DETERMINING RESIDUAL COUPLING OF AN INDUCTIVE CONDUCTIVITY SENSOR

TECHNICAL FIELD

The invention relates to a method for determining residual coupling of an inductive, conductivity sensor, in which the conductivity sensor is surrounded by a measured medium and an equivalent impedance of the medium is calibrated with a variable compensation impedance; wherein the variable compensation impedance and the equivalent impedance of the medium act on a measuring coil of the conductivity sensor with a phase shift of 180°.

BACKGROUND DISCUSSION

Inductive conductivity sensors are usually evaluated with electrical current measuring methods, wherein the output current of the measuring coil of the inductive, conductivity sensor is measured by a circuit whose input impedance lies near zero. Since an undesired residual coupling of the coils exists in every inductive, conductivity sensor, such residual coupling, which is also referred to as "air set," must be measured once at the initial start-up of the inductive, conductivity sensor. This is done while the conductivity sensor is in the air, where an ideal conductivity sensor issues no measurement signal, while a real conductivity sensor, in contrast, has a non-zero signal. During the running of the measurement operation of the conductivity sensor, measurement results are corrected with the residual coupling so ascertained. The residual coupling is usually measured only a single time, while the inductive, conductivity sensor remains in operation for months or years. In this time, the inductances of the conductivity sensor are subject to an aging related drift, so that the residual coupling of the conductivity sensor changes. Since the residual coupling is temperature dependent, a further drift of the residual coupling brings about a reduction in the accuracy of measurement of the conductivity sensor.

DE 41 16 468 A1 discloses a method for determining the functional ability of an inductive, conductivity sensor, in which, supplemental to a measuring conductor loop, which has an equivalent impedance of the medium, an additional conductor loop is present, which has a variable impedance.

It is known from DE 102 86 79 A1 that, for measuring conductivity, the conductivity sensor, including the conductor loop, is placed in the measured medium and the variable impedance is changed. Since the equivalent impedance of the medium and the variable impedance act on the measuring coil of the conductivity sensor with a 180° phase shift, the magnitudes of the equivalent impedance of the medium and of the variable impedance cancel exactly, if the output voltage of the conductivity sensor is equal to zero. Thus, the magnitude of the variable impedance corresponds equally to the value of the equivalent impedance of the medium. In order to achieve an exact measurement result, this method requires that the variable impedance is exact over a broad adjustment range of 6 to 7 orders of magnitude, and that it has a linear transfer function, as well as temperature stability and long term stability. These requirements are not implementable in practice, so that the results of this measuring method are not sufficiently exact.

SUMMARY OF THE INVENTION

Thus, an object of the invention is to provide a method for determining the residual coupling of an inductive, conductivity sensor that permits measuring of residual coupling with a high accuracy of measurement at any time during operation of the conductivity sensor.

According to the invention, the object thereby is achieved by the feature that the variable compensation impedance is varied until an output voltage of the measuring coil of the conductivity sensor assumes a minimum voltage, wherein the complex minimum voltage corresponds to the residual coupling of the inductive, conductivity sensor. Thus, it is not necessary to determine the exact value of the variable compensation impedance. Through determining a minimum of the output voltage of the inductive, conductivity sensor, all types of impedances can be applied, also when these have neither temperature stability nor long term stability over a large adjustment range, nor a linear transfer function in their input range. The aging and temperature dependent drift of the inductances of the conductivity sensor are taken into consideration, in such a case, in the new determination of the residual coupling.

Advantageously, a measurement voltage of the conductivity sensor determined during a measurement with the conductivity sensor is corrected with the minimum voltage. Since the residual coupling can be measured in the most varied of temperatures, a temperature dependent compensation of the residual coupling occurs, so that inaccuracies in the measurement voltage are reliably removed. Since only residual coupling is determined, the output signal of the inductive, conductivity sensor can be measured according to the known standard electrical current measuring method.

In an embodiment, the minimum voltage is appropriately subtracted from the measurement voltage of the conductivity sensor. Thus, this method can be performed at all times during the operation of the sensor.

In a further development, determining the minimum voltage occurs between two measurements of conductivity of the measured medium with the conductivity sensor, while maintaining the conductivity sensor immersed in the measured medium. Because of the continuous immersion of the conductivity sensor and thus, the measured impedance of the measured medium as well as the variable compensation impedance of the measured medium, the circuit construction for a normal measurement with the sensor and a calibration measurement for determining the residual coupling can be the same, which especially results in cost and time savings for operating the inductive, conductivity sensor.

In a variant, the equivalent impedance of the medium is a component of a measuring conductor loop of the conductivity sensor, while the variable compensation impedance is arranged in a reference conductor loop of the inductive, conductivity sensor, wherein the reference conductor loop is turned on or off during operation of the inductive, conductivity sensor. Measurement operation can be alternated with calibration operation by simple circuitry, including software activation of the reference conductor loop over the total lifetime of the conductivity sensor.

Advantageously, for turning the reference conductor loop off, the variable compensation impedance is set to a impedance value which is significantly larger, preferably at least by a factor of 1000, than the equivalent impedance of the medium. Through this procedure, the impedance is set so high that an electrical current flow in the reference conductor loop is reliably suppressed.

Alternatively, the reference conductor loop is opened for turning it off. This measure is simply implemented by the application of a controllable switch.

In an additional form of embodiment, at least the last measured minimum voltage is stored and used for appropriately subtracting the residual coupling from following measurement signals of the inductive, conductivity sensor. In this way, changes in quality of the conductivity sensor can be directly reacted to, by inserting the calibration step for determining the residual coupling of the inductive, conductivity sensor at all desired times into the normal operation of the conductivity sensor. Thus, it is assured that, at any time, an exact measurement result of the conductivity sensor is generated.

In a further development, the minimum voltages measured last in a current calibration step as well as at least one minimum voltage of the conductivity sensor determined in a preceding calibration step are stored and subjected to a diagnosis, wherein an alarm is triggered when at least one stored minimum voltage exceeds a threshold value. Through the diagnosis of the stored minimum voltages, serious disturbances of the conductivity sensor can be registered at any time without requiring further effort in time and material and the conductivity sensor replaced, if required.

Additionally, a potentiometer or an impedance decade with at least one relay or a transimpedance operational amplifier is used as a variable compensation impedance. Since the output voltage of the measuring coil of the inductive, conductivity sensor is only calibrated to a minimum but not zero, all possible ohmic impedances for this measuring method for determining the residual coupling of the inductive, conductivity sensor can be applied. Although digital potentiometers have a large temperature drift and time drift with increasing time, or a voltage controlled impedance has too small a range of adjustment and a non-linear transfer function as well as non-linear behavior, these are applicable in the method of the invention at any time. Thus, the use of costly components is absent.

BRIEF DESCRIPTION OF THE DRAWINGS

The invention permits numerous forms of embodiment. One of them will now be explained in greater detail based on the figures presented in the drawing. The figures of the drawing show as follows.

DETAILED DESCRIPTION IN CONJUNCTION WITH THE DRAWINGS

Figure 1:
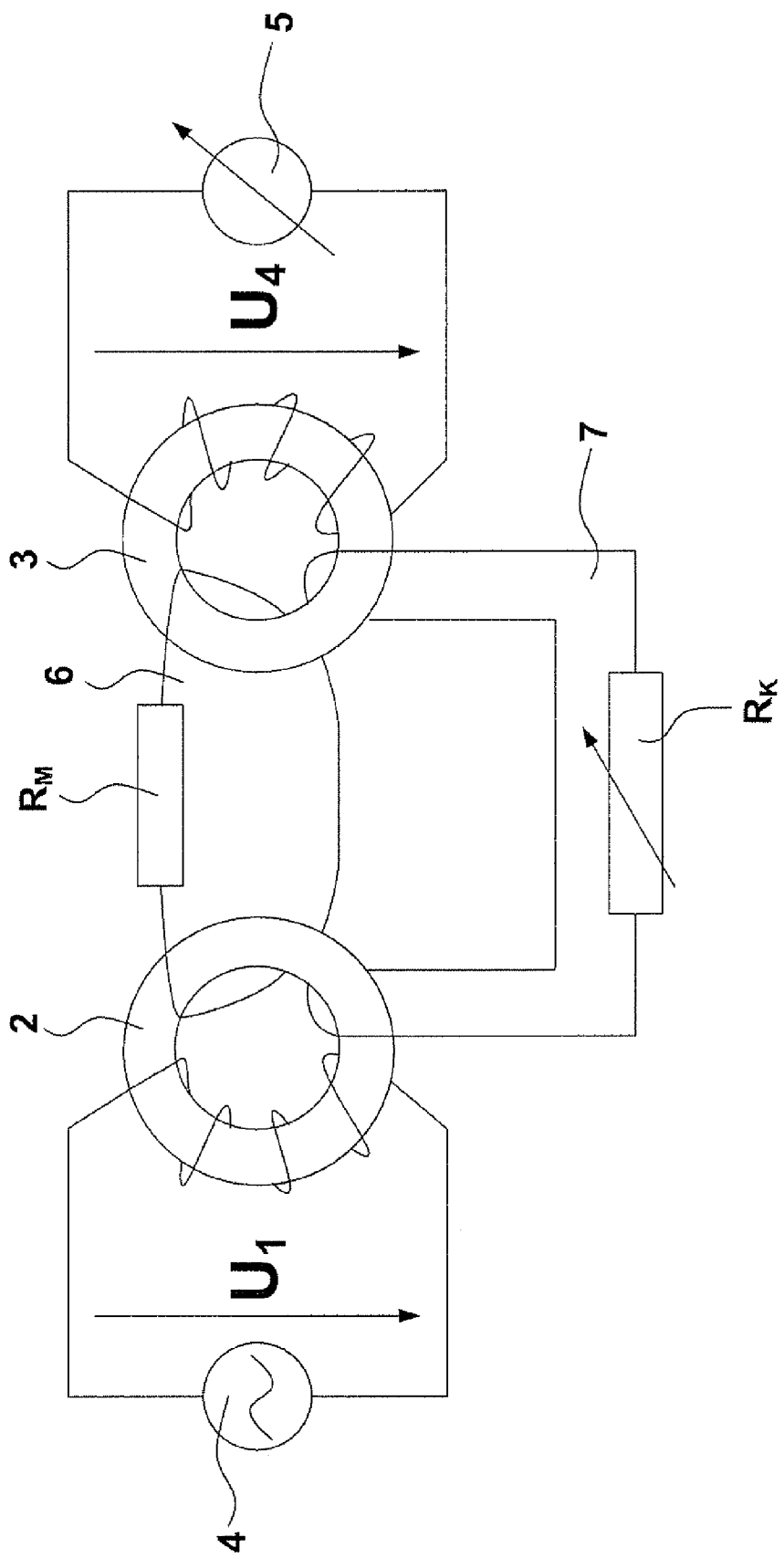
FIG. 1 is a schematic diagram of an inductive, conductivity sensor.

FIG. 1 shows a schematic representation of an inductive, conductivity sensor 1 as applied for measuring electrical conductivity of media, especially liquids. Conductivity sensor 1 comprises an exciter coil 2 and a measuring coil 3. The exciter coil 2 is connected to an electrical current source 4, which excites the exciter coil 2 with an alternating electrical current. The measuring coil 3 lies in a measuring arrangement 5. The exciter coil 2 and measuring coil 3 are connected to one another via a first conductor loop 6, in which an equivalent impedance $R_M$ of the medium is located. A variable compensation impedance $R_K$ is arranged in a second conductor loop 7, which likewise incorporates the exciter coil 2 and the measuring coil 3. Each of the conductor loops 6, 7 has the form of a closed, ring-shaped, electrically conducting path. The equivalent impedance $R_M$ of the medium of the first conductor loop 6 is determined by the conductivity of the medium to be examined. In order to measure conductivity, the conductivity sensor 1 is inserted sufficiently into the medium to be examined that a closed, conducting path forms between the exciter coil 2 and the measuring coil 3. When the exciter coil 2 is supplied with the alternating voltage of the electrical current source 4, a magnetic field is produced, which induces an electrical current in the closed path of the first conductor loop 6. The size of the induced electrical current depends on the electrical conductivity of the medium to be examined. This electrical current, which is likewise an alternating electrical current, is measured inductively with the measuring coil 3.

Figure 2:
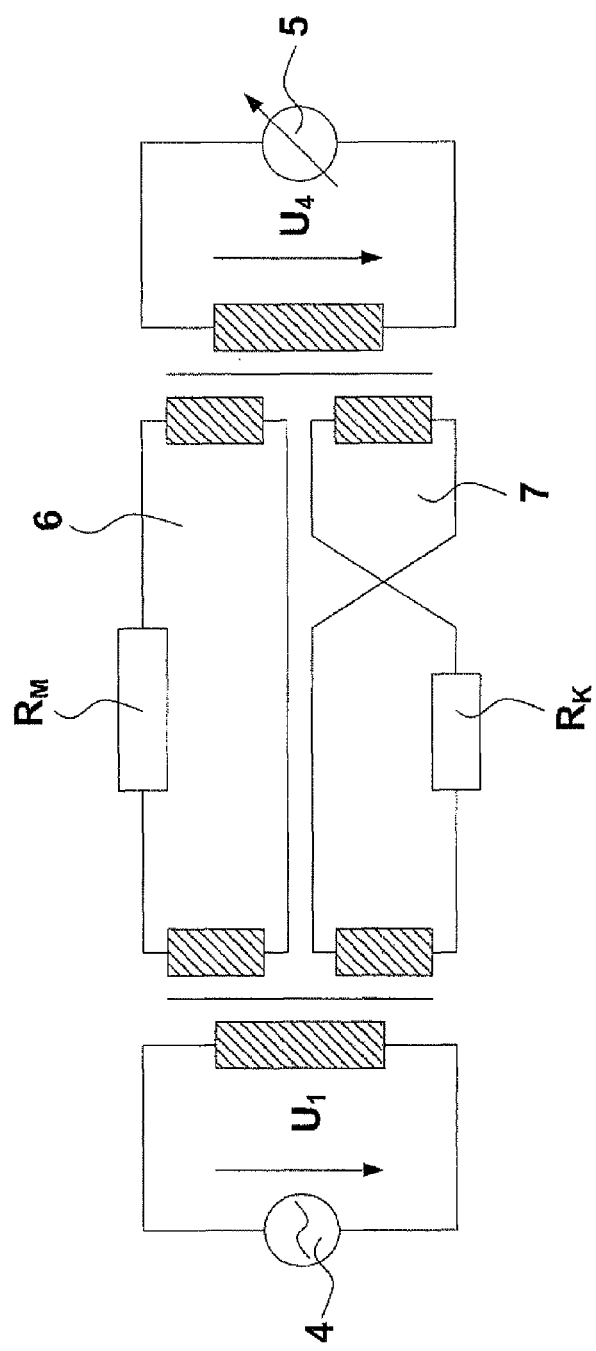
FIG. 2 is an equivalent circuit diagram of the inductive, conductivity sensor of FIG. 1.

The equivalent circuit diagram in FIG. 2 shows that the second conductor loop 7 containing the variable compensation impedance $R_K$ is led through the exciter coil 2 and the measuring coil 3 in such a way that it acts on the exciter and the measuring coil 2, 3 with a phase shift of 180°. Due to the properties of electromagnetic fields relative to inductive couplings, the residual coupling is phase offset by 90° from the measurement signal detected by the measuring arrangement 4. Thus, the residual coupling is not compensated by a real impedance in the second conductor loop 7. This fact is used in the proposed method, which will be explained on the basis of an example in the following.

Figure 3:
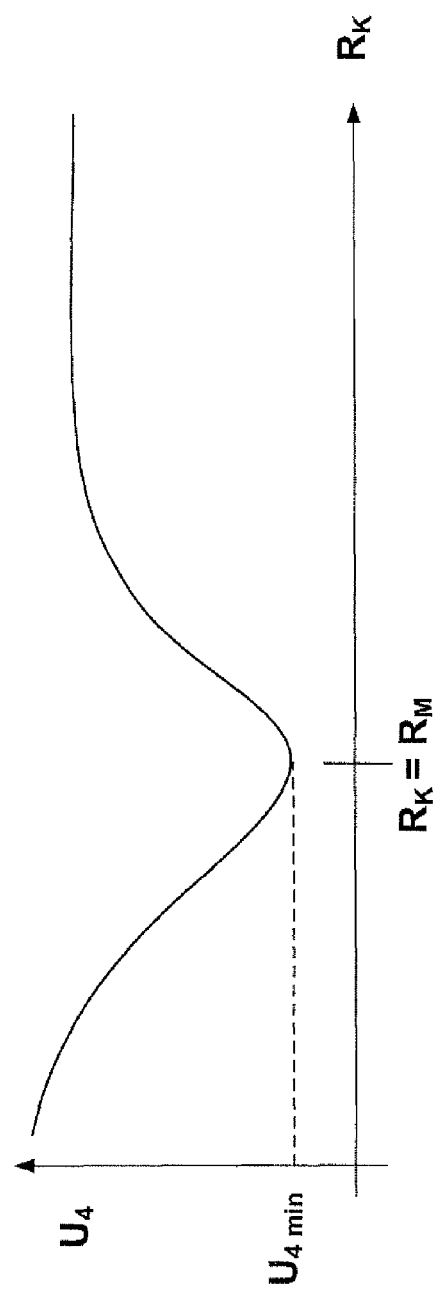
FIG. 3 is a curve of the output voltage of the inductive, conductivity sensor according to FIG. 1 as a function of a variable compensation impedance

In a first step, the inductive, conductivity sensor 1 is immersed in a measured medium, which has a predetermined conductivity, which results in the equivalent impedance $R_M$ of the medium. A measure of the conductivity of the medium is the output voltage $U_4$ of the measuring coil 3. In an additional step, the second conductor loop 7, which contains the compensation impedance $R_K$, is switched in by a switch (not shown), which is operated by a control device. The compensation impedance $R_K$ is then changed, until the output voltage $U_4$ of the conductivity sensor 1, as measured by the measuring device 5, has a minimum. This behavior is presented in FIG. 3. The exact value of the compensation impedance $R_K$ does not have to be known for this. At this minimum output voltage $U_{4min}$, the equivalent impedance of the medium $R_M$ equals the compensation impedance $R_K$, wherein the minimal output voltage $U_{4min}$ corresponds to the still present residual coupling. Thus, the inductive, conductivity sensor 1 only measures the magnitude and phase of the residual coupling, due to the 90° phase shift of the residual coupling in comparison to the measurement signal $U_4$. The measured value of the residual coupling is stored.

After the residual coupling is determined, the second conductor loop 7 is taken out of operation by opening the switch and normal measurements of the conductivity of the measured medium continue. In such a case, the last measured and stored value of the residual coupling is appropriately subtracted from the raw measured value, i.e. the output voltage $U_4$ of the inductive, conductivity sensor 1, in order to obtain the measured value.

A comparison of residual coupling ascertained by the method of the invention with residual coupling determined according to the state of the art, as measured using a normal voltage measurement in air, is shown in the following table.

| $R_{medium}$ | Measurement | |
|---|---|---|
| | Magnitude (µV) | Phase (°) |
| Residual coupling in air | 13.09 | 162.29 |
| Residual coupling in the medium RM = RK | | |
| 100 Ω | 13.14 | 165.27 |
| 1 kΩ | 13.23 | 162.66 |
| 10 kΩ | 13.35 | 160.74 |

A determination of the residual coupling according to the invention can be repeated at any time (e.g. daily or monthly) during the operation of the inductive, conductivity sensor 1, without the inductive, conductivity sensor 1 having to be removed from the medium to be examined.

The inductive, conductivity sensor 1 can be embodied especially simply as a circuit card sensor, wherein the second conductor loop 7 is integrated, without great extra effort, directly into the circuit board.

The invention claimed is:

1. A method for determining residual coupling of an inductive, conductivity sensor, in which the conductivity sensor is surrounded by a measured medium and an equivalent impedance of the medium is calibrated with a variable compensation impedance; wherein the variable compensation impedance and the equivalent impedance of the medium act on a measuring coil of the conductivity sensor with a phase shift of 180°, comprising the step of:
   varying the variable compensation impedance until an output voltage of the measuring coil of the conductivity sensor assumes a minimum voltage wherein:
   the complex minimum voltage corresponds to the residual coupling of the inductive, conductivity sensor;
   the equivalent impedance of the medium is a component of a measuring conductor loop of the conductivity sensor, while the variable compensation impedance is arranged in a reference conductor loop of the inductive, conductivity sensor; and
   the reference conductor loop is turned on and, respectively, off during operation of the inductive, conductivity sensor.

2. The method as claimed in claim 1, wherein:
a measurement voltage of the conductivity sensor determined during a measurement procedure of the conductivity sensor, is corrected with the minimum voltage.

3. The method as claimed in claim 2, wherein:
the minimum voltage is appropriately subtracted from the measurement voltage of the conductivity sensor.

4. The method as claimed in claim 1, wherein:
determining the minimum voltage occurs while maintaining immersion of the conductivity sensor in the measured medium; and
between two measurements with the conductivity sensors, in which conductivity of the measured medium is determined.

5. The method as claimed in claim 1, wherein:
for turning the reference conductor loop off, the variable compensation impedance is set to a impedance value which is essentially larger, preferably at least by a factor of 1000, than the equivalent impedance of the medium.

6. The method as claimed in claim 1, wherein:
the reference conductor loop is opened for turning it off.

7. The method as claimed in claim 1, wherein:
at least the last measured minimum voltage is stored and used for appropriately subtracting residual coupling from following measurement signals of the inductive, conductivity sensor.

8. The method as claimed in claim 7, wherein:
minimum voltages measured last in a current calibration step as well as at least one minimum voltage of the conductivity sensor determined in a preceding calibration step are stored and subjected to a diagnosis; and
an alarm is triggered when at least one stored minimum voltage exceeds a threshold value.

9. The method as claimed in claim 1, wherein:
a potentiometer or an impedance decade having at least one relay or a transimpedance operational amplifier is applied as variable compensation impedance.

10. A method for determining residual coupling of an inductive, conductivity sensor, in which the conductivity sensor is surrounded by a measured medium and an equivalent impedance of the medium is calibrated with a variable compensation impedance; wherein the variable compensation impedance and the equivalent impedance of the medium act on a measuring coil of the conductivity sensor with a phase shift of 180°, comprising the step of:
   varying the variable compensation impedance until an output voltage of the measuring coil of the conductivity sensor assumes a minimum voltage wherein:
   the complex minimum voltage corresponds to the residual coupling of the inductive, conductivity sensor; and
   at least the last measured minimum voltage is stored and used for appropriately subtracting residual coupling from following measurement signals of the inductive, conductivity sensor.

\* \* \* \* \*